(12) United States Patent
Watanabe et al.

(10) Patent No.: US 8,477,252 B2
(45) Date of Patent: Jul. 2, 2013

(54) DISPLAY APPARATUS WITH GATE LEADING LINES OF DIFFERING LENGTHS

(75) Inventors: Hitoshi Watanabe, Tokyo (JP); Hiromitsu Ishii, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 313 days.

(21) Appl. No.: 12/891,496

(22) Filed: Sep. 27, 2010

(65) Prior Publication Data

US 2011/0234957 A1 Sep. 29, 2011

(30) Foreign Application Priority Data

Sep. 28, 2009 (JP) .................................. 2009-223022

(51) Int. Cl.
*G02F 1/1333* (2006.01)
*G02F 1/1343* (2006.01)
*G02F 1/1345* (2006.01)

(52) U.S. Cl.
USPC .............. 349/40; 349/139; 349/149; 349/151

(58) Field of Classification Search
USPC ..................... 349/40, 139, 149, 151; 257/210
See application file for complete search history.

(56) References Cited

U.S. PATENT DOCUMENTS

| | | |
|---|---|---|
| 2002/0080317 A1 | 6/2002 | Yeo et al. |
| 2003/0227078 A1* | 12/2003 | Chang ............................ 257/693 |
| 2007/0273802 A1 | 11/2007 | Nakamura |
| 2007/0278488 A1 | 12/2007 | Hirabayashi et al. |
| 2008/0074404 A1 | 3/2008 | Sashida |
| 2008/0117345 A1 | 5/2008 | Ishii et al. |

FOREIGN PATENT DOCUMENTS

| | | |
|---|---|---|
| JP | H9-265110 A | 10/1997 |
| JP | H11-85058 A | 3/1999 |
| JP | H11-218782 A | 8/1999 |
| JP | 2000-56724 A | 2/2000 |
| JP | 2000-267137 A | 9/2000 |
| JP | 2002-277893 A | 9/2002 |
| JP | 2004-086093 A | 3/2004 |
| JP | 2005-529360 A | 9/2005 |

(Continued)

OTHER PUBLICATIONS

Japanese Office Action dated Sep. 20, 2011, in a counterpart Japanese Patent application No. 2009-223022, citing Foreign Patent document Nos. 1-7 above.

(Continued)

*Primary Examiner* — Nathanael R Briggs
(74) *Attorney, Agent, or Firm* — Chen Yoshimura LLP

(57) ABSTRACT

A display apparatus includes a first gate line extended in a predetermined direction; a second gate line extended in parallel to the first gate line; a first gate output terminal corresponding to the first gate line; a second gate output terminal corresponding to the second gate line; a first gate leading line electrically connecting the first gate line to the first gate output terminal; a second gate leading line electrically connecting the second gate line to the second gate output terminal and having a length longer than said first gate leading line; and a static electric protection line disposed so as to overlap the first gate leading line and the second gate leading line with an insulating layer interposed between said static electric protection line and the first and second gate leading lines, wherein an overlapping area between the first gate leading line and the static electric protection line is larger than an overlapping area between the second gate leading line and the static electric protection line.

18 Claims, 11 Drawing Sheets

FOREIGN PATENT DOCUMENTS

| | | |
|---|---|---|
| JP | 2006-71814 A | 3/2006 |
| JP | 2007-316104 A | 12/2007 |
| JP | 2007-322761 A | 12/2007 |
| JP | 2008-077005 A | 4/2008 |
| JP | 2008-129374 A | 6/2008 |
| KR | 10-2003-0043415 A | 6/2003 |
| KR | 10-2008-0046603 A | 5/2008 |
| WO | 03/104882 A1 | 12/2003 |

OTHER PUBLICATIONS

Japanese Office Action dated Jan. 31, 2012, in a counterpart Japanese Patent application No. 2009-223022.

Korean Office Action dated Nov. 7, 2011, in a counterpart Korean Patent application No. 10-2010-0093431.

* cited by examiner

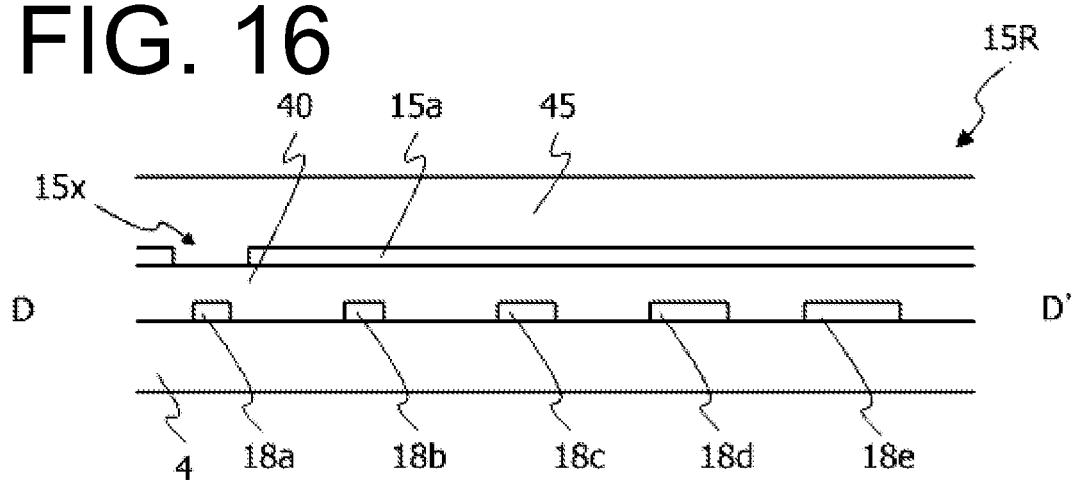
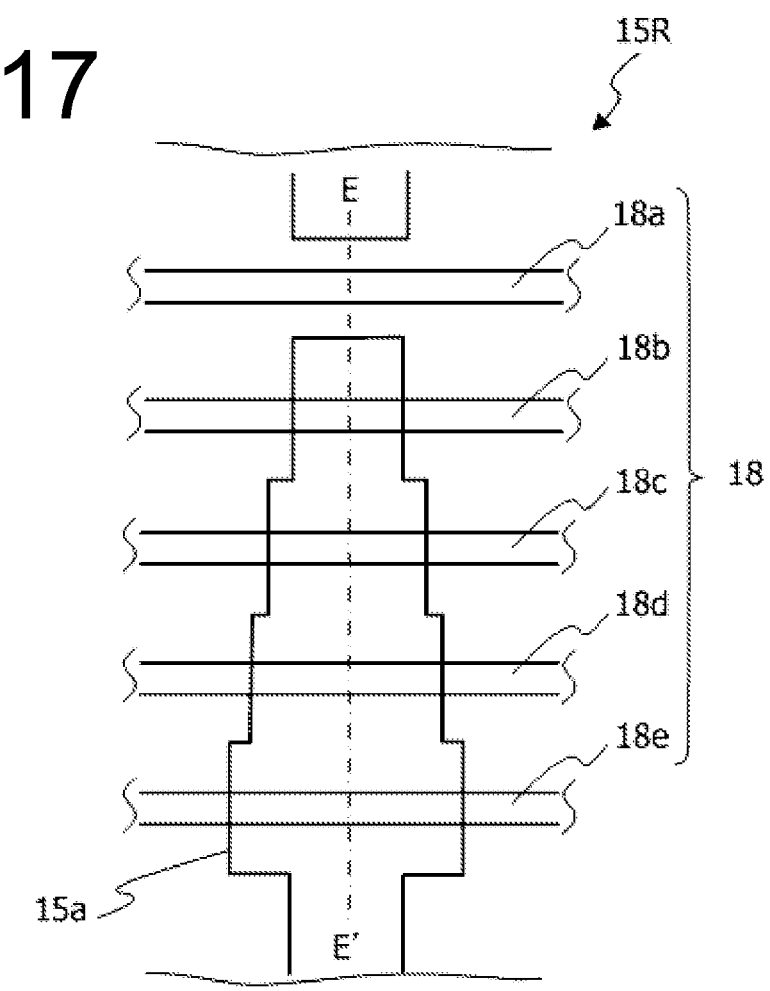

DISPLAY APPARATUS WITH GATE LEADING LINES OF DIFFERING LENGTHS

CROSS-REFERENCE TO RELATED APPLICATIONS

This application is based upon and claims the benefit of priority from the prior Japanese Patent Application No. 2009-223022, filed Sep. 28, 2009, the entire contents of which are hereby incorporated by reference.

BACKGROUND OF THE INVENTION

1. Field of the Invention

The invention relates to a display apparatus, and more particularly, to a display apparatus in which the lengths of gate leading lines are different from each other.

2. Description of the Related Art

In an active matrix type liquid crystal display (LCD) apparatus that is used as a display apparatus, a thin film transistor (hereinafter referred to as a TFT) and a pixel electrode connected to the TFT are located adjacent to an intersection of a gate line and a source line. In addition, between the pixel electrode and an opposite electrode (common electrode) that is disposed so as to face the pixel electrode, a liquid crystal layer is formed. Moreover, by applying a voltage in accordance with the gray scale level to the pixel electrode through the TFT, which is selected by a scanning signal that is input via the gate line, an orientational state of the liquid crystal layer changes to the orientational state corresponding to the gray scale level.

In the meantime, in the above-described LCD apparatus, there is an apparatus in which a driving circuit is mounted as COG (Chip On Glass) on a prescribed region of a display panel. For example, Japanese Patent Application Laid Open JP 2006-71814 suggests a display apparatus in which among the sides of a display panel, at the side that is in parallel to the extending direction of gate lines, a projection area in which one substrate projects from the other substrate is provided, and a semiconductor device is mounted on the projection area as an IC chip that is composed of a gate driver for driving gate lines and/or a source driver for driving source lines.

However, when the gate driver is mounted on such a side of display panel that is parallel to the extending direction of the gate lines as described above, the wiring lengths of leading lines that are electrically connecting the gate lines to the gate driver are different from each other. Therefore, the time constants between the gate lines and the gate driver are different for respective gate lines. Even when the gate driver outputs a scanning signal from output terminals thereof such that on-voltages for the scan signal are the same among the gate lines, each of effective voltages of the on-voltages applied to TFTs is different with respect to each gate line. Therefore, even when a voltage corresponding to a gray scale level is being written onto each of the pixel electrodes, actual voltages that are kept in the pixel electrodes are different for different rows. For example, when a whole screen is to be displayed with the same gray level, this voltage differential results in a problem of a reduction in image quality because it causes differences in brightness on the screen.

BRIEF SUMMARY OF THE INVENTION

The present invention aims to provide a display apparatus, in which the reduction in image quality can be prevent, even when each of lengths of wiring lines that are electrically connecting gate lines to a gate driver are different with respect to each gate line.

In one aspect, the present invention provides a display apparatus including a first gate line extended in a predetermined direction; a second gate line extended in parallel to the first gate line; a first gate output terminal corresponding to the first gate line; a second gate output terminal corresponding to the second gate line; a first gate leading line electrically connecting the first gate line to the first gate output terminal; a second gate leading line electrically connecting the second gate line to the second gate output terminal and having a length longer than the first gate leading line; and a static electric protection line disposed so as to overlap the first gate leading line and the second gate leading line with an insulating layer interposed between the static electric protection line and the first and second gate leading lines, wherein a width of the first gate leading line in a region where the first gate leading line overlaps the static electric protection line is larger than a width of the second gate leading line in a region where the second gate leading line overlaps the static electric protection line, and wherein an overlapping area between the first gate leading line and the static electric protection line is larger than an overlapping area between the second gate leading line and the static electric protection line.

In another aspect, the present invention provides a display apparatus including a plurality of gate lines transmitting a scanning signal to thin film transistors that are formed in pixels; a plurality of gate leading lines electrically connecting the respective gate leading lines to corresponding designated gate output terminals; and a static electric protection line crossing the plurality of gate leading lines, wherein lengths of the plurality of gate leading lines are different with respect to each other, and areas of intersections between the respective gate leading lines and the static electric protection line differ with respect to each other, wherein a width of a gate leading line with the length thereof being shorter in a region where the gate leading line with the shorter length overlaps the static electric protection line is set larger than a width of a gate leading line with the length thereof being longer in a region where the gate leading line with the longer length overlaps the static electric protection line, and wherein the area of an intersection between a gate leading line having a shorter length and the static electric protection line is larger than the area of an intersection between a gate leading line having a longer length and the static electric protection line.

In another aspect, the present invention provides a display apparatus including a plurality of pixel electrodes; a common electrode; a liquid crystal layer disposed between the plurality of pixel electrodes and the common electrode; a plurality of thin film transistors connecting respective source electrodes thereof to the corresponding pixel electrodes; a plurality of gate lines connected to gate electrodes of the thin film transistors; a plurality of gate output terminals; a plurality of gate leading lines electrically connecting the respective gate lines to corresponding gate output terminals; and a common line receiving a voltage that is equal to a voltage applied to the common electrode, the common line intersecting the plurality of gate leading lines, wherein areas of intersections where the plurality of gate leading lines intersects the common line differ with respect to each other.

According to the present invention, even when the lengths of electrical connecting lines connecting the gate lines to a gate driver are different with respect to each gate line, reduction of image quality can be effectively prevented.

Other advantages of the invention will be set forth in the description which follows, and in part will be apparent or obvious from the description, or may be learned by practice of the invention.

The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 16 is a cross-section view of the intersection regions taken along the line D-D' shown in FIG. 15.

FIG. 17 is a top view of intersection regions of gate leading lines and a common line, which is disposed as a static electrical line in an exemplary variation.

DETAILED DESCRIPTION OF THE INVENTION

Figure 1:
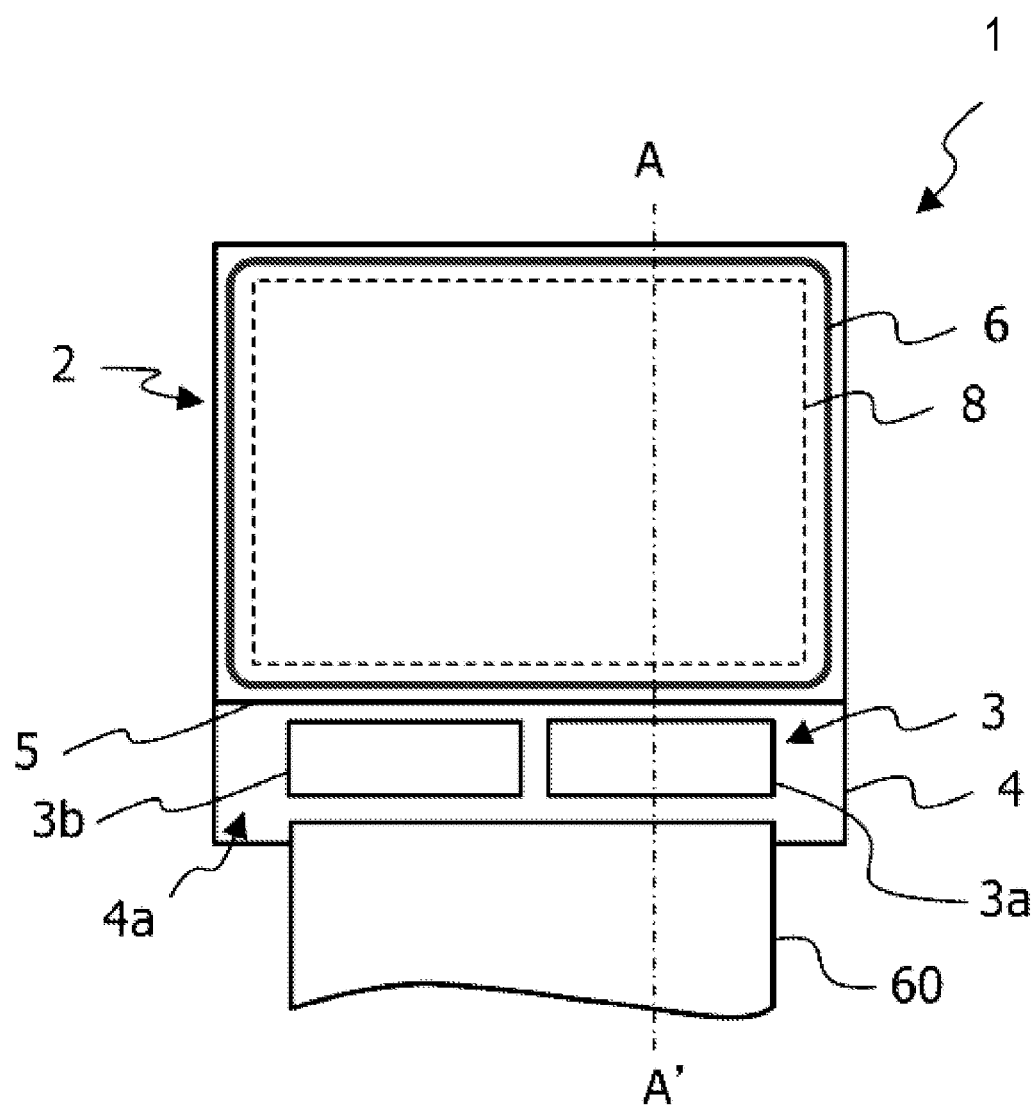
FIG. 1 is a schematic top view of a liquid crystal display apparatus.
Figure 2:
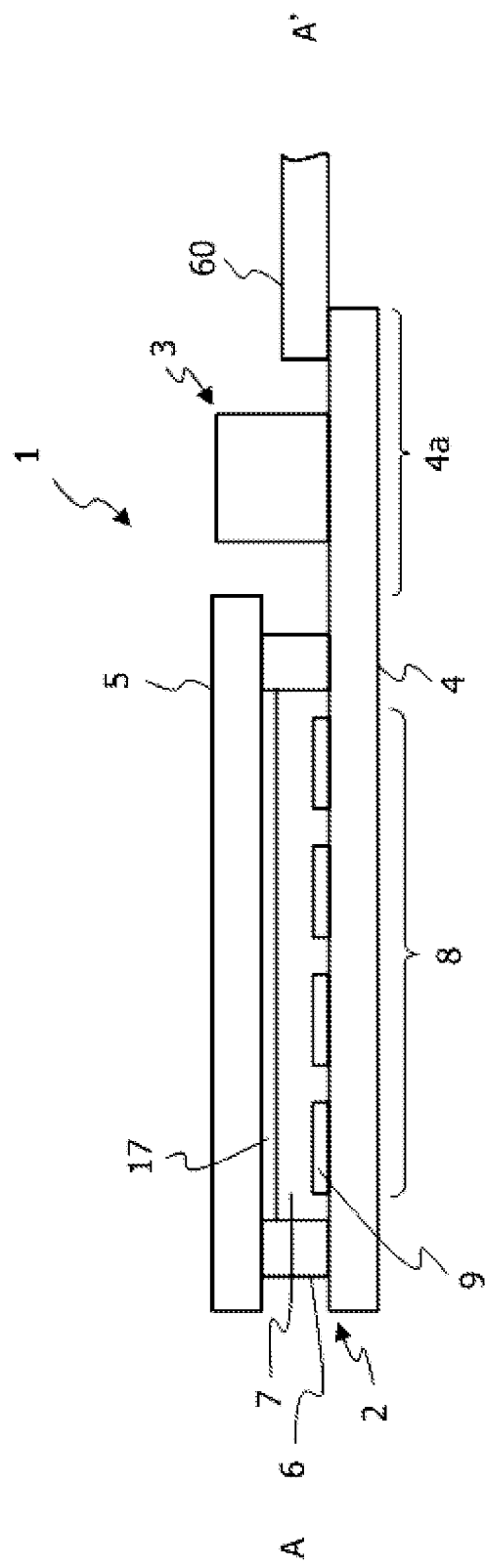
FIG. 2 is a schematic cross-section view of the liquid crystal display apparatus taken along the line A-A' of FIG. 1.

Exemplary embodiments for implementing the present invention will now be described with reference to the figures. FIG. 1 shows a schematic top view of an active matrix type LCD apparatus as a display apparatus according to an embodiment of the present invention. A cross-section view of the LCD apparatus is shown in FIG. 2. The LCD apparatus 1 is provided with a display panel 2, a driver circuit 3 to drive the display panel 2, and a FPC (Flexible printed circuit) 60 for connecting the driver circuit 3 to an external circuit. The driver circuit 3 is composed of a gate driver 3a and a data driver 3b. In addition, the gate driver 3a and the data driver 3b are formed from IC chips as semiconductor devices and are mounted on the display panel 2 by COG (Chip on Glass) mounted on a prescribed region of the display panel 2.

The display panel 2 is made by attaching an active substrate 4 to an opposite substrate 5, which is disposed so as to face the active substrate 4, with a sealing material 6 formed therebetween in a substantially rectangular frame shape. In a region surrounded by the frame-shaped sealing material 6 between the substrates 4 and 5, a liquid crystal layer 7 is formed. In addition, the active substrate 4 has a projecting portion 4a projecting from the opposite substrate 5. The driver circuit 3 is mounted on the projecting portion 4a, and the FPC 60 is attached to the projecting portion 4a. Here, a rectangular region surrounded by the dotted line depicted in FIG. 1 is identified as a display area 8. And the sealing material 6 is provided so as to surround the display area 8. Further, the active substrate 4 and the opposite substrate 5 are formed of a transparent material such as glass, etc.

Figure 3:
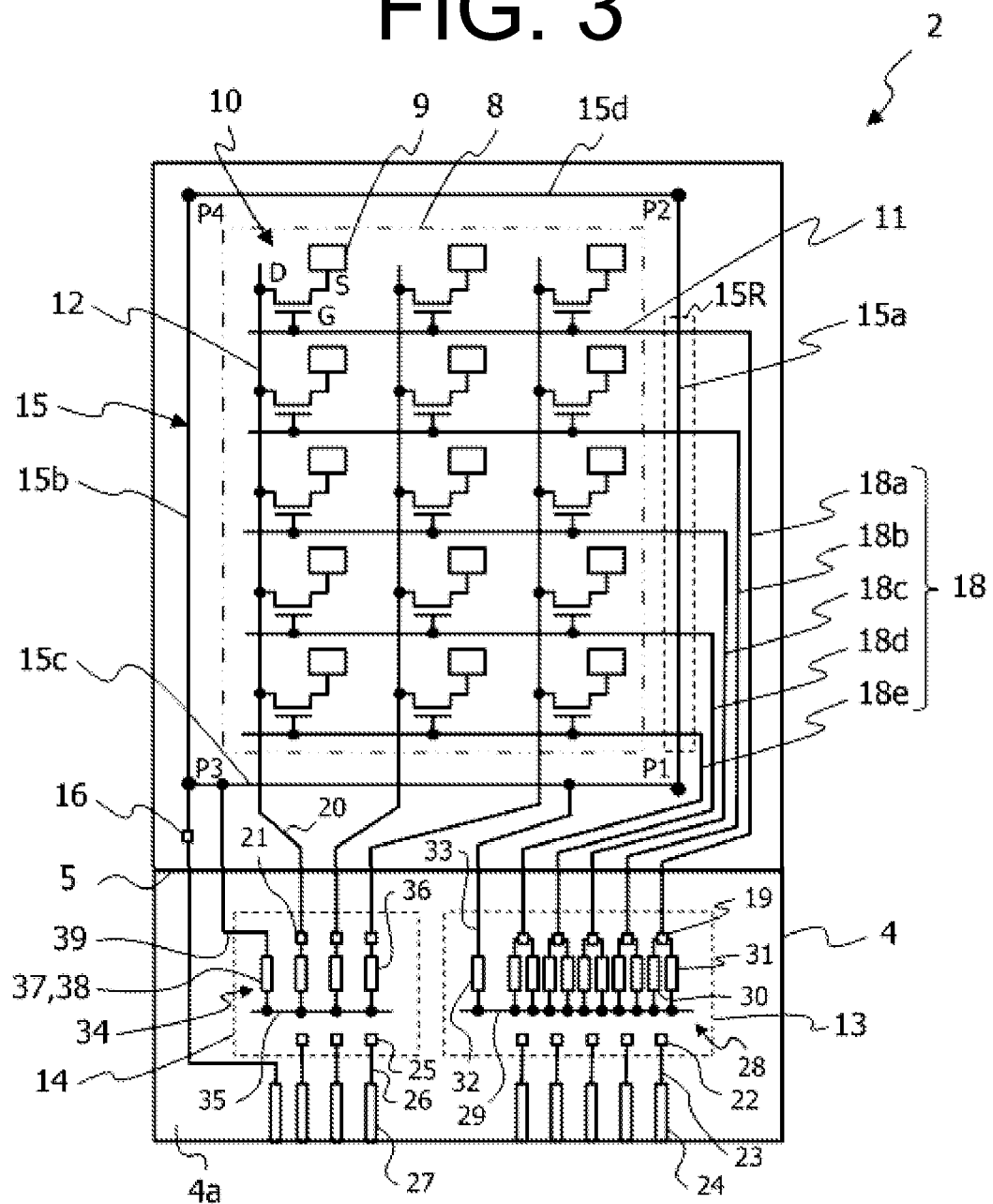
FIG. 3 is a top view showing an equivalent circuit of a display panel.

FIG. 3 is a top view showing an equivalent circuit of a substantial part of the display panel 2. Pixels are arranged in a matrix in the display area 8. On the active substrate 4, a transparent pixel electrode 9 and an n-MOS type switching TFT 10 are formed in each of the pixels. The pixel electrode 9 is made of ITO, etc. In addition, the pixel electrode 9 is connected to a source electrode S of the n-MOS type switching TFT 10. The gate electrode G of the switching TFT 10 is connected to a gate line 11, and the drain electrode D is connected to a data line 12. Here, the gate line 11 is to transmit a scanning signal output from the gate driver 3a to the switching TFT 10, and a plurality of gate lines is formed on the active substrate 4 so as to extend in rows to be associated with respective pixel rows. The data line 12 is to transmit a gray scale signal output from the data driver 3b to the pixel electrode 9 via the switching TFT 10, and a plurality of data lines is formed on the active substrate 4 so as to extend in columns to be associated with respective pixel columns.

The projecting portion 4a is provided on a side that is parallel to the extending direction of the gate lines 11 at a side of the display panel 2. Moreover, the projecting portion 4a is provided with a gate driver mounting area 13 for mounting the gate driver 3a and a data driver mounting area 14 for mounting the data driver 3b.

Although, in FIG. 3, only a matrix of 5 rows and 3 columns of pixel electrodes 9 is shown for simplicity, in reality, a matrix of several hundred rows and columns or more is provided. Around the display area 8 on the active substrate 4, a common line 15 that is used as a static electric protection ring formed in a rectangular frame shape and a contact pad 16 that is connected thereto are provided. The contact pad 16 is connected to a transparent common electrode 17 that is composed of ITO or the like formed on the opposite substrate 5 that faces the active substrate 4 via a conductive material between the substrates. That is, the common line 15 is disposed so that the common line 15 and the common electrode 17 assume the same voltage.

The gate lines 11 are connected to gate leading lines 18 that extend from an end of the gate lines 11 toward the projecting portion 4a so as to bypass the display area 8. The gate line 11 is electrically connected to a gate output terminal 19, which is arranged on the gate driver mounting area 13 of the projecting portion 4a, via the respective gate leading line 18. In addition, the data lines 12 are connected to data leading lines 20 that extend from an end of the data lines 12 towards the projecting portion 4a. The data line 12 is electrically connected to a data output terminal 21, which is arranged on the data driver mounting area 14 of the projecting portion 4a, via the respective data leading line 20. The gate output terminal 19 is a connecting terminal for electrically connecting, via the gate leading line 18, the gate line 11 to a gate driver 3a mounted on the gate driver mounting area 13, and a prescribed connecting terminal of the gate driver 3a that outputs a scanning signal is connected to the gate output terminal 19 upon the COG mounting. Moreover, the data output terminal 21 is a connecting terminal for electrically connecting, via the data leading line 20, the data line 12 to the data driver 3b mounted on the data driver mounting area 14, and a prescribed connecting terminal of the data driver 3b that outputs a gray scale signal is connected to the data output terminal 21 upon the COG mounting.

On the gate driver mounting area 13, gate input terminals 22 are provided so as to be parallel to the arranging direction of the gate output terminals 19. The gate input terminal 22 is a connecting terminal for transmitting a signal transmitted from an external circuit to the gate driver 3a via the FPC 60, and the gate input terminal 22 is connected to a prescribed connecting terminal of the gate driver 3a. Moreover, the gate input terminals 22 are connected to respective gate external connecting terminals 24 via first input lines 23, respectively, which extend toward the lower end of the active substrate 4. In addition, the gate external connecting terminal 24 is connected to a prescribed connecting terminal formed on the FPC 60.

On the data driver mounting area 14, data input terminals 25 are provided so as to be parallel to the arranging direction of the data output terminals 21. The data input terminal 25 is a connecting terminal for transmitting a signal transmitted from an external circuit to the data driver 3b via the FPC 60, and the data input terminal 25 is connected to a prescribed connecting terminal of the data driver 3b. Moreover, the data input terminals 25 are connected to respective data external connecting terminals 27 via second input lines 26, respectively, which extend toward the lower end of the active substrate 4. The data external connecting terminal 27 is connected to a prescribed connecting terminal formed on the FPC 60.

Figure 4:
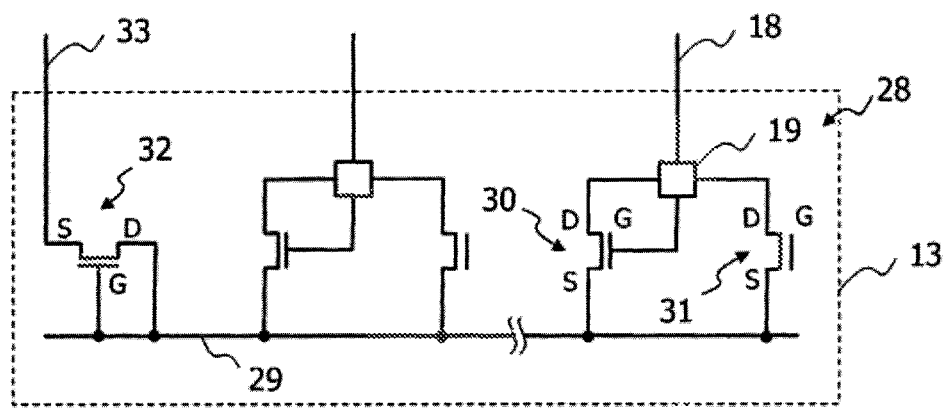
FIG. 4 is a top view showing an equivalent circuit of a static electric protection circuit for gate lines.

FIG. 4 is a top view showing an equivalent circuit of a gate line static electric protection circuit 28, which is provided on the gate driver mounting area 13. The gate line static electric protection circuit 28 includes a gate line static electric protection line 29, a diode connection TFT 30 and a first floating gate TFT 31.

In the diode connection TFT 30, the gate electrode G and the drain electrode D are connected to each other at the gate output terminal 19, and the source electrode S of the TFT 30 is connected to the gate line static electric protection line 29. The gate electrode G of the first floating gate type TFT 31 is isolated, and therefore becomes a floating gate. The drain electrode D of the TFT 31 is connected to the gate output terminal 19, and the source electrode S of the TFT 31 is connected to the gate line static electric protection line 29. That is, the diode connection TFT 30 and the first floating gate TFT 31 are connected in parallel between the gate output terminal 19 and the gate line static electric protection line 29.

An end of the gate line static electric protection line 29 is connected to the common line 15 via a connecting TFT 32 and a first connecting leading line 33. The gate electrode G and the drain electrode D of the connecting TFT 32 are connected to the gate line static electric protection line 29, and the source electrode S of the connecting TFT 32 is connected to the common line 15 via the first connecting leading line 33.

Figure 5:
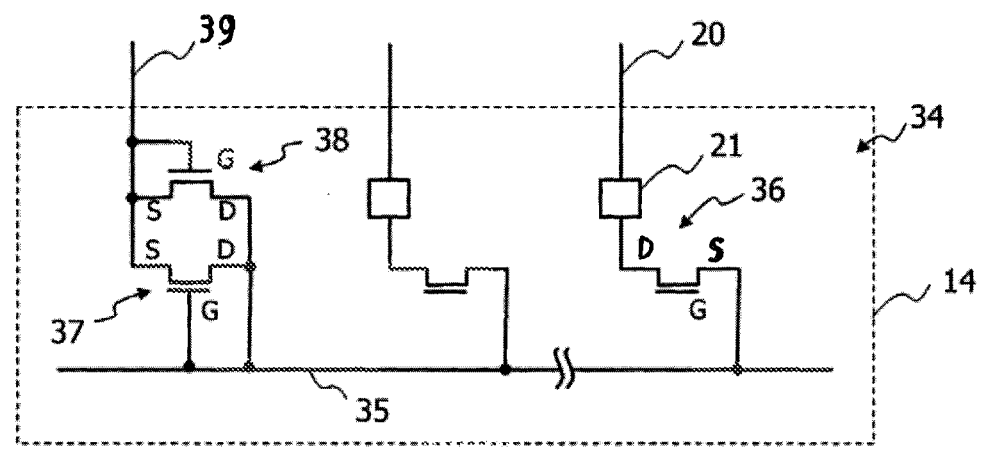
FIG. 5 is a top view showing an equivalent circuit of a static electric protection circuit for data lines.

FIG. 5 is a top view showing an equivalent circuit of a data line static electric protection circuit 34, which is provided on the data driver mounting area 14. The data line static electric protection circuit 34 includes a data line static electric protection line 35 and a second floating gate TFT 36.

In the second floating gate TFT 36, the gate electrode G is isolated and becomes a floating gate. The drain electrode D of the TFT 36 is connected to the data output terminal 21, and the source electrode S the TFT 36 is connected to the data line static electric protection line 35.

An end of the data line static electric protection line 35 is connected to the common line 15 via the first and second connecting TFTs 37, 38, which are provided in parallel, and via the second connecting leading line 39. The gate electrode G and the drain electrode D of the first connecting TFT 37 are connected to the data line static electric protection line 35, and the source electrode S of the first connecting TFT 37 is connected to the common line 15 via the second connecting leading line 39. In addition, the gate electrode G and the source electrode S of the second connecting TFT 38 are connected to the common line 15 via the second connecting leading line 39, and the drain electrode D of the second connecting TFT 38 are connected to the data line static electric protection line 35.

Figure 6:
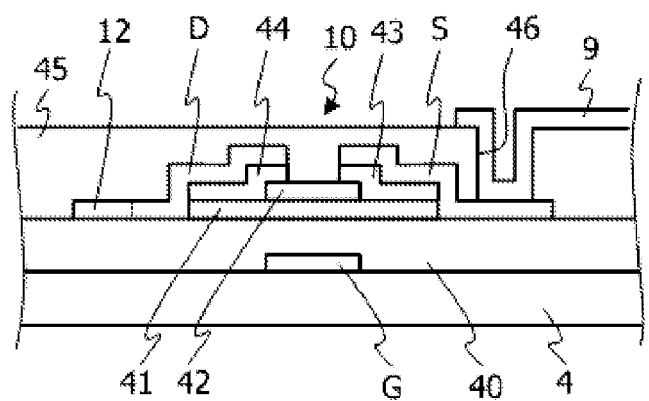
FIG. 6 is a cross-section view of a switching thin film transistor.

Next, a specific layer structure of the pixels in the display panel will now be described. FIG. 6 is a cross-section view of the switching TFT 10 and the pixel electrode 9. On a prescribed portion of the surface of the active substrate 4 made of glass or the like that faces the opposite substrate 5, as a first conductive layer, a gate electrode G that is made of molybdenum, chrome or the like and the gate line 11 that is connected to the gate electrode G are provided. Also, the gate leading lines 18 are formed as the first conductive layer in the same manner as the gate lines 11 that are respectively connected to the gate leading lines 18.

A gate insulating film 40 that is composed of silicon nitride, for example, is provided on the first conductive layer. A semiconductor thin film 41 that is composed of intrinsic amorphous silicon, for example, is provided on the gate insulating film 40. A channel protection film 42 that is composed of silicon nitride, for example, is provided on a central part of the semiconductor thin film 41.

Ohmic contact layers 43, 44 that are composed of n-type amorphous silicon, for example, are provided on respective sides of the channel protection film 42 and on the semiconductor 41. A source electrode S that is composed of molybdenum, chrome or the like is provided on the ohmic contact layer 43 and on a prescribed region of the gate insulating film 40 that is located adjacent to the ohmic contact layer 43. On the other ohmic contact layer 44 and on a prescribed region of the gate insulating film 40, a drain electrode D that is composed of molybdenum, chrome or the like and the data line 12 that is connected to the drain electrode D are provided.

Here, the switching TFT 10 is composed of the gate electrode G, the gate insulating film 40, the semiconductor thin film 41, the channel protection film 42, the ohmic contact layers 43, 44, the source electrode S and the drain electrode D. Here, the source electrode S, the drain electrode D and the data line 12 are formed as a second conductive layer. Also, the data leading line 20 is formed as the second conductive layer in the same way as the data line 12 that is connected to the data leading line 20.

On the switching TFT 10 and the data line 12, an overcoat film 45 made of silicon nitride, for example, is provided. A pixel electrode 9 made of a transparent material, such as ITO or the like, is provided on the overcoat film 45. The pixel electrode 9 is connected to the source electrode S via a contact hole 46, which is provided in a prescribed part of the overcoat film 45.

Figure 7:
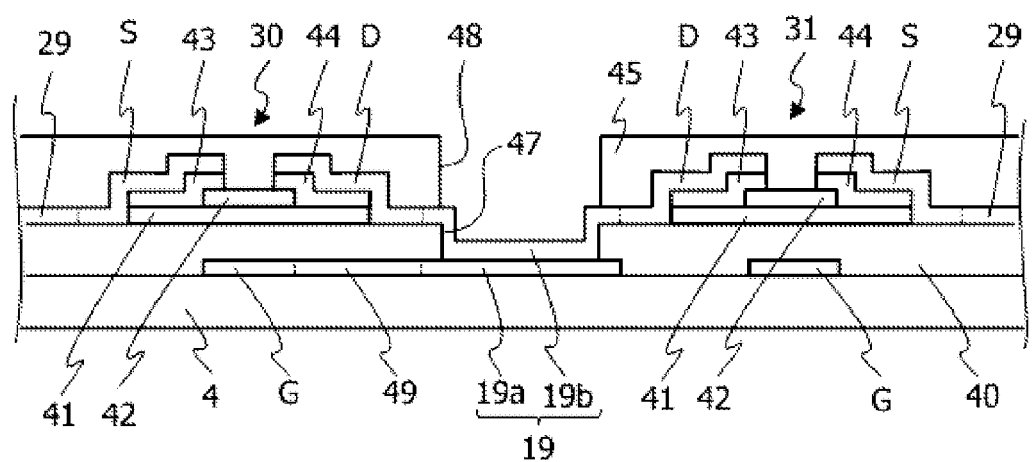
FIG. 7 is a cross-section view of a mounting area for a gate driver.

Next, a specific layer structure of the gate driver mounting area 13 will now be described. FIG. 7 is a cross-section view of the gate line static electric protection line 29, the diode connection TFT 30, the first floating gate TFT 31 and the gate output terminal 19, which are provided in the gate driver mounting area 13. The diode connection TFT 30 and the floating gate TFT 31 have a layer structure that is almost identical to the switching TFT 10, and the TFTs 30, 31 are composed of the gate electrode as the above-described first conductive layer, the gate insulating film 40, the semiconductor film 41, the channel protection film 42, the ohmic contact layers 43, 44, and the source electrode S and the drain electrode D as the above-described second conductive layer.

The gate output terminal 19 is formed by a two-layer laminated structure of a lower metallic layer 19a and an upper metallic layer 19b. The lower metallic layer 19a is provided in the above-mentioned first conductive layer on the surface of the active substrate 4 facing the opposite substrate 5, and is made of molybdenum or chrome, etc. The upper metallic layer 19b is provided on a portion of the lower metallic layer 19a exposed from the gate insulating film 40 via a contact hole 47 formed in the gate insulating film 40 and on the adjacent portions of the gate insulating film 40 surrounding the exposed lower metallic layer 19a. The upper metallic layer 19b is formed in the above-mentioned second conductive layer. The lower metallic layer 19a is connected to the gate leading line 18, which is provided as the first conductive layer in the same way as the lower metallic layer 19a. In addition, a part of the upper metallic layer 19b is exposed from the overcoat film 45 via an opening portion 48, which is provided in the overcoat film 45. A gate line static electric protection line 29 is formed on the gate insulating 40 in the above-described second conductive layer, and is made of a metallic layer, such as molybdenum, chrome or the like.

In the diode connection TFT 30, the gate electrode G that is formed in the first conductive layer is connected to the lower metallic layer 19a of the gate output terminal 19 via a leading line 49, which is formed as the first conductive layer in the same way as the gate electrode G and is made of molybdenum or chrome, etc. The drain electrode D of the TFT 30 is connected to the upper metallic layer 19b of the gate output terminal 19, and the source electrode S of the TFT 30 is connected to the gate line static electric protection line 29. The gate electrode G of the first floating gate type TFT 31 is isolated and therefore becomes a floating gate. The drain electrode D of the TFT 31 is connected to the upper metallic layer 19a of the gate output terminal 19, and the source electrode S of the TFT 31 is connected to the gate line static electric protection line 29.

Figure 8:
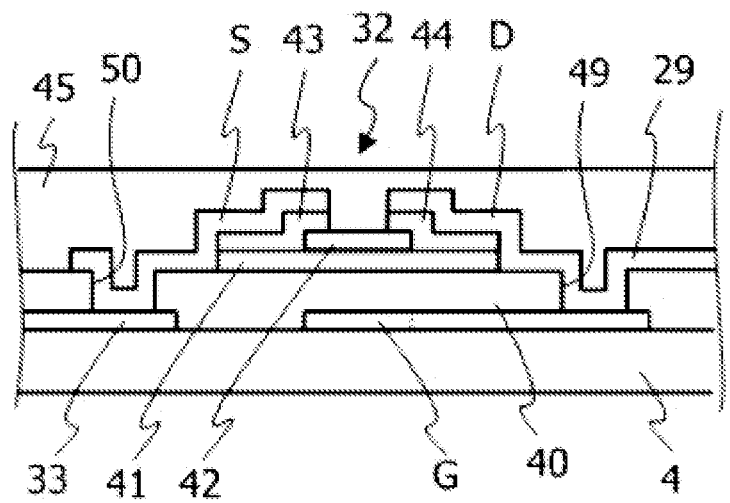
FIG. 8 is a cross-section view of a mounting area for a gate driver.

FIG. 8 is a cross-section view of the connecting TFT 32, the gate line static electric protection line 29 and the first connecting leading line 33, which are provided in the gate driver mounting area 13. The connecting TFT 32 is formed by a layer structure that is almost identical to the switching TFT 10, and is composed of the gate electrode G as the above-described first conductive layer, the gate insulating film 40, the semiconductor film 41, the channel protection film 42, the ohmic contact layers 43, 44, and the source electrode S and the drain electrode D that are formed as the above-described second conductive layer. The first connecting leading line 33 is made of a metallic layer, such as molybdenum, chrome or the like, which is provided in the first conductive layer.

An end of the gate line static protection line 29, which is provided on the gate insulating film 40, is connected to the drain electrode D of the connecting TFT 32 as well as to the gate electrode G of the connecting TFT 32 via a contact hole 49, which is provided in the gate insulating film 40. The source electrode S of the connecting TFT 32 is connected to the first connecting leading line 33 via a contact hole 50 formed in the gate insulating film 40.

Figure 9:
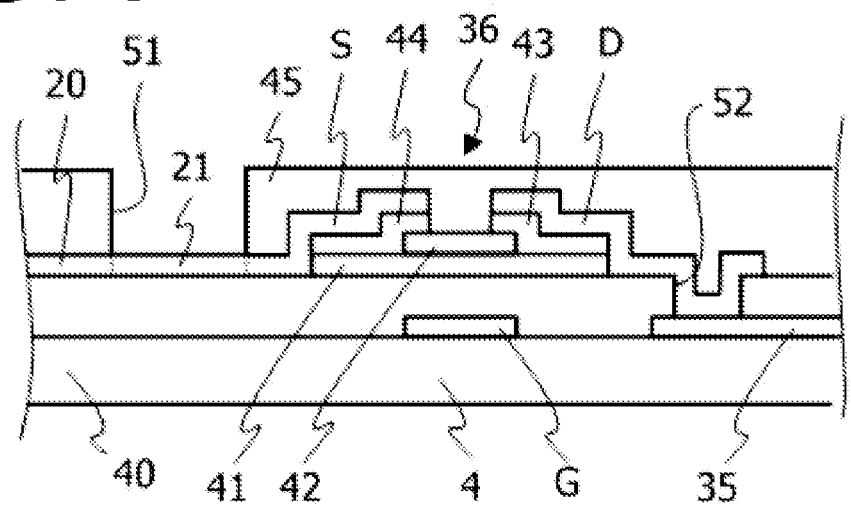
FIG. 9 is a cross-section view of a mounting area for a data driver.

Next, a specific layer structure of the data driver mounting area 14 will now be described. FIG. 9 is a cross-section view of the second floating gate TFT 36, the data output terminal 21 and the data line static electric protection line 35. The second floating gate TFT 36 is formed by a layer structure that is almost identical to the switching TFT 10, and is composed of the gate electrode G in the above-described first conductive layer, the gate insulating film 40, the semiconductor film 41, the channel protection film 42, the ohmic contact layers 43, 44, and the source electrode S and the drain electrode D that are formed as the above-described second conductive layer.

The data output terminal 21 is made of a metallic layer, such as molybdenum, chrome or the like, which is disposed on the gate insulating film 40 as the above-described second conductive layer. The data output terminal 21 is connected to the data leading line 20, which is likewise disposed as the second conductive layer. In addition, a part of this metallic layer is exposed from the overcoat film 45 via an opening portion 51, which is provided in the overcoat film 45. The data line static electric protection line 35 is made of a metallic layer, such as molybdenum, chrome or the like, which is provided as the above-described first conductive layer. The gate electrode G of the second floating gate TFT 36 is isolated and therefore becomes a floating gate. In addition, the source electrode S of the TFT 36 is connected to the data output terminal 21, and the drain electrode D of the TFT 36 is connected to the data line static electric protection line 35 via a contact hole 52 formed in the gate insulating film 40.

Figure 10:
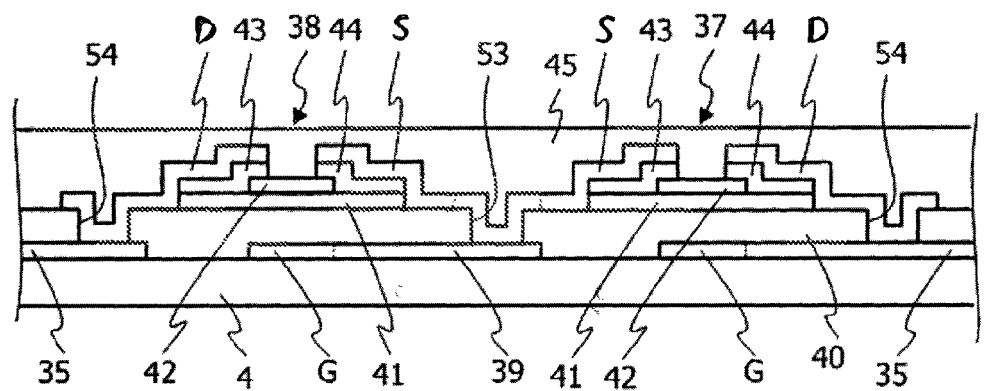
FIG. 10 is a cross-section view of a mounting area for a data driver.

FIG. 10 is a cross-section view of the first and second connecting TFTs 37, 38, the data line static electric protection line 35 and the second connecting leading line 39, which are provided in the data driver mounting area 14. The first and second connecting TFTs 37, 38 are formed by a layer structure that is almost identical to the switching TFT 10, and are composed of the gate electrode G in the above-described first conductive layer, the gate insulating film 40, the semiconductor film 41, the channel protection film 42, the ohmic contact layers 43, 44, and the source electrode S and the drain electrode D that are formed in the above-described second conductive layer. The second connecting leading line 39 is made of a metallic layer, such as molybdenum, chrome or the like, which is disposed in the above-described first conductive layer.

The gate electrode G of the first connecting TFT 37 is connected to the data line static electric protection line 35. The gate electrode G of the second connecting TFT 38 is connected to the connecting leading line 39. Moreover, the source electrode S of the first connecting TFT 37 and the source electrode S of the second connecting TFT 38 are connected to the second connecting leading line 39 via a contact hole 53 formed in the gate insulating film 40. The drain electrode D of the first connecting TFT 37 and the drain electrode D of the second connecting TFT 38 are connected to the data static electric protection line 35 via the same contact hole 54 (although shown separately in FIG. 10), which is provided in the gate insulating film 40.

Returning to FIG. 3, a common line 15 as a static electric protection ring is provided with a first line piece 15a, a second line piece 15b, a third line piece 15c and a fourth line piece 15d within a region at which the active substrate 4 overlaps the opposite substrate 5. The first and second line pieces 15a, 15b extend in parallel with the data lines 12, and the third and fourth line pieces 15c, 15d extend in parallel with the gate lines 11.

The first line piece 15a and the second line piece 15b are made of a metallic layer such as molybdenum, chrome or the like, which is provided in the second conductive layer. The third line piece 15c and the fourth line piece 15d are made of a metallic layer, such as molybdenum, chrome or the like, which is provided in the first conductive layer. In addition, the first line piece 15a is connected to the third line piece 15c at an intersection P1 via a contact hole formed in the gate insulating film 40, and is connected to the fourth line piece 15d at an intersection P2 via a contact hole formed in the gate insulating film 40. Moreover, the second line piece 15b is connected to the third line piece 15c at an intersection P3 via a contact hole formed in the gate insulating film 40, and is connected to the fourth line piece 15d at an intersection P4 via a contact hole formed in the gate insulating film 40.

That is, at the edges of the extending direction of the gate lines 11, the first line piece 15a and the second line piece 15b are formed in a layer different from a layer in which the gate leading lines 18 are disposed as the first conductive layer. Furthermore, at the edges of the extending direction of the data lines 12, the third line piece 15c and the fourth line piece 15d are formed in a layer different from a layer in which the data leading lines 20 are provided in the second conductive layer. FIG. 3 shows an example where the gate leading lines 18 cross the first line pieces 15a, and the data leading line 20s cross the third line piece 15c in different layers, respectively.

Figure 11:
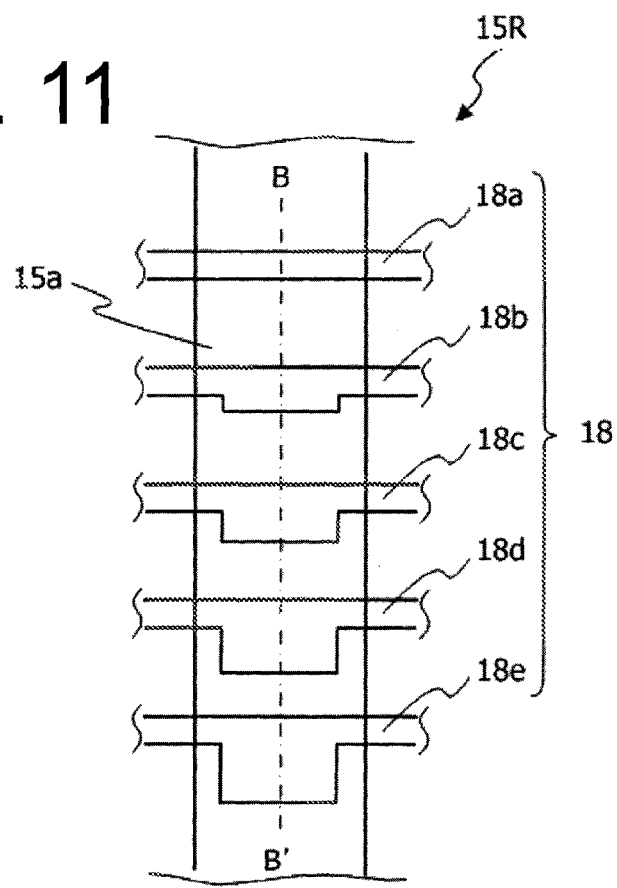
FIG. 11 is a top view of intersection regions of gate leading lines and a common line, which is disposed as a static electric protection line.
Figure 12:
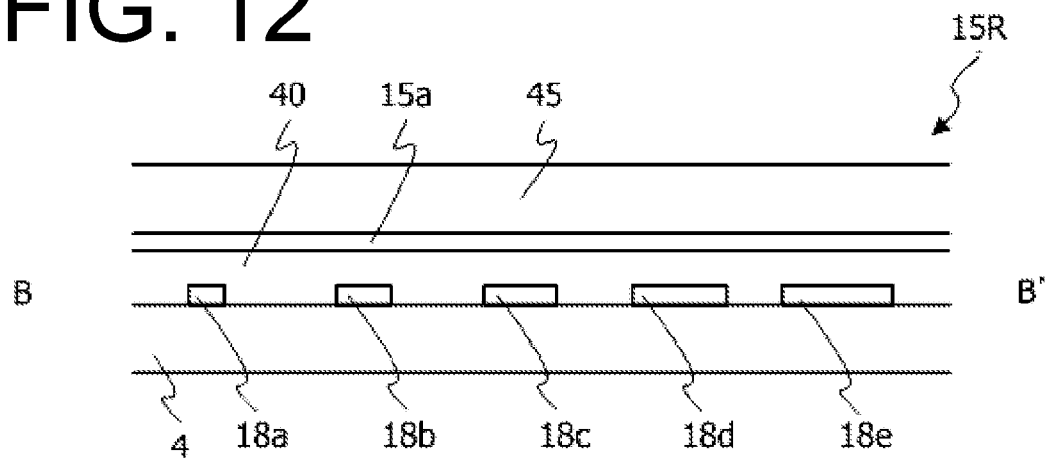
FIG. 12 is a cross-section view of the intersection regions taken along the line B-B' shown in FIG. 11.

In this embodiment, in a region 15R where the first line piece 15a crosses the gate leading lines 18, each of the gate leading lines 18 is configured such that the overlapping area of the gate leading line 18 with the first line piece 15a via the gate insulating film 40 is set in accordance with a distance from the end of the corresponding gate line 11 to the gate output terminal 19 to which that gate leading line 18 is connected. For example, as shown in FIG. 11 and FIG. 12, when the length of the gate leading lines 18 are such that it progressively decreases in the order of the gate leading lines 18a, 18b, 18c, 18d and 18e, the overlapping area with the first line piece 15a via the gate insulating film 40 is configured to become progressively larger in the order of the gate leading lines 18a, 18b, 18c, 18d and 18e. More specifically, the gate leading lines 18 are formed such that the width of the gate leading line 18 in the overlapping area with the first line piece 15a progressively increases in the order of the data leading lines 18a, 18b, 18c, 18d and 18e.

In this example, in regions other than the region 15R where the first line piece 15a crosses the gate leading lines 18, each gate leading line 18 may be formed with the same constant width. Also, the common line 15 may be formed with a constant wiring width.

In this embodiment, the widths of the gate leading lines 18 are adjusted at the region 15R where the common line 15 crosses the gate leading lines 18 such that a time constant RC of each gate leading line 18 from the corresponding gate line 11 to the corresponding gate input terminal 19—i.e., a product RC of a resistance R of the gate leading line 18 and a parasitic capacitance C in the gate leading line 18—is made substantially equal among the gate leading lines 18. This way, the effective voltage of an on-signal as a scanning signal input to the TFTs 10 can be made substantially equal with respect to each gate line 11. Thus, even when the length of the gate leading line 18 that is electrically connected between the gate line 11 and the gate driver 3a is different every row, deterioration of the display quality can be prevented.

In addition, according to the present embodiment, the time constant for each of the gate lines 11 is adjusted in the overlapping region with the common line 15, which acts as the static electric protection ring and which necessarily intersects with the gate leading line 18. Therefore, because an adjusting region for the time constant need not be newly provided, the apparatus size is not affected. Moreover, because the wiring width of the gate leading line 18 may be adjusted, a new layer for adjusting the time constant need not be provided, and therefore the number of the manufacturing steps need not be increased.

Figure 13:
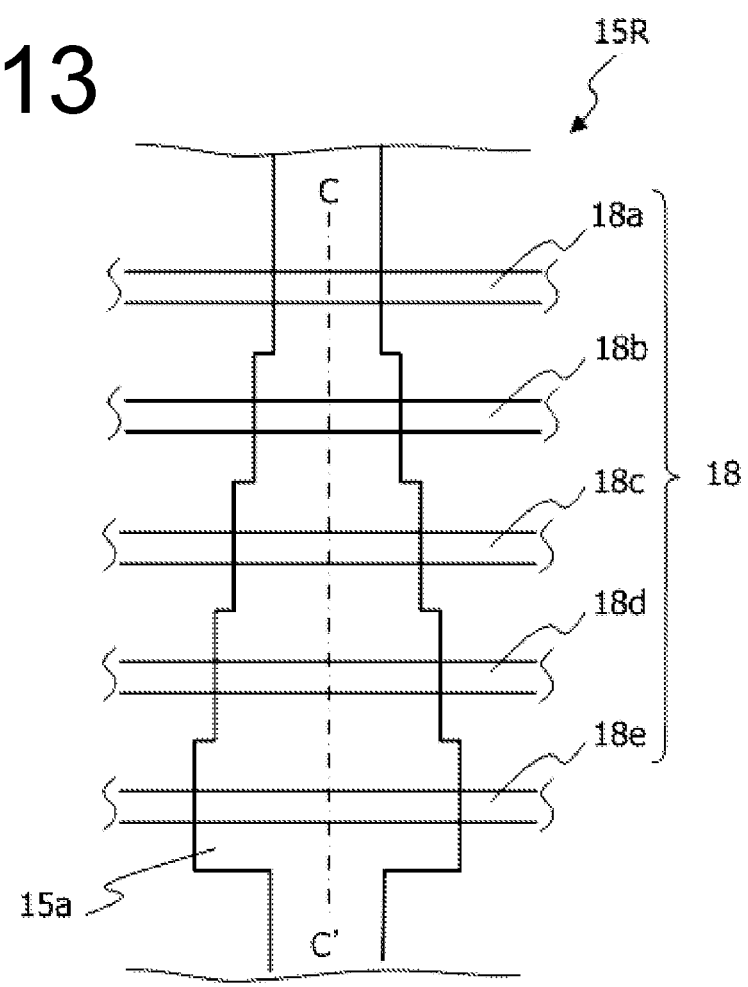
FIG. 13 is a top view of intersection regions of gate leading lines and a common line, which is disposed as a static electrical line in an exemplary variation.
Figure 14:
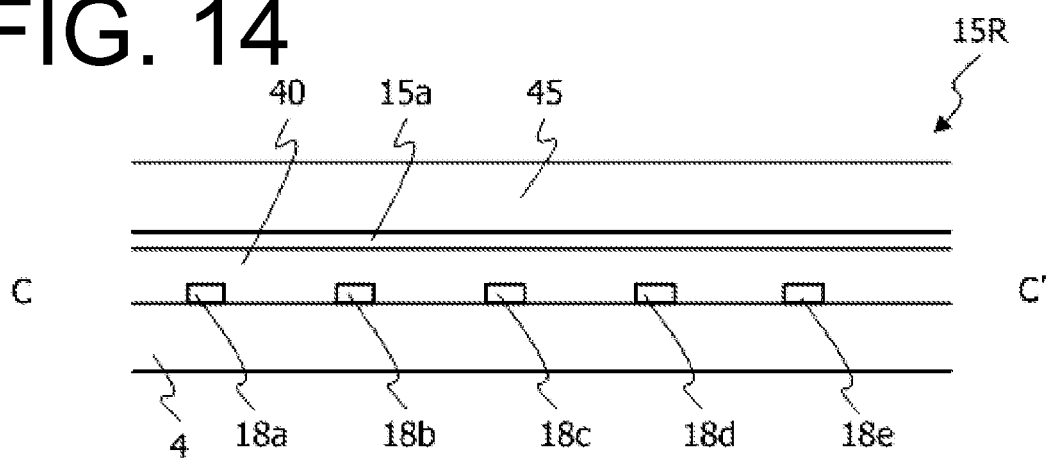
FIG. 14 is a cross-section view of the intersection regions taken along the line C-C' shown in FIG. 13.
Figure 15:
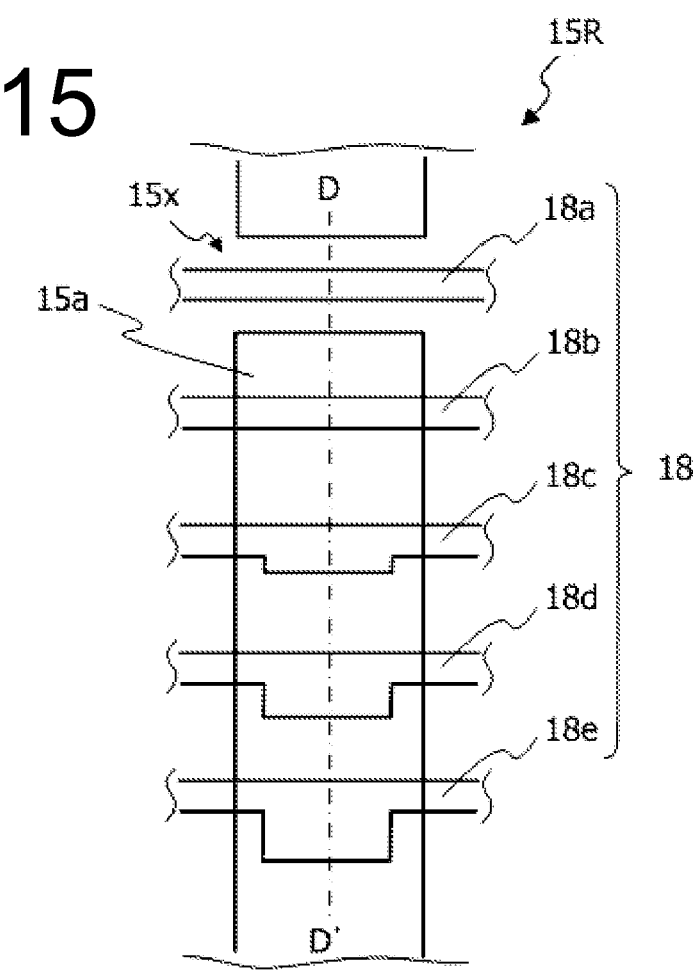
FIG. 15 is a top view of intersection regions of gate leading lines and a common line, which is disposed as a static electrical line, in an exemplary variation.
Figure 18:
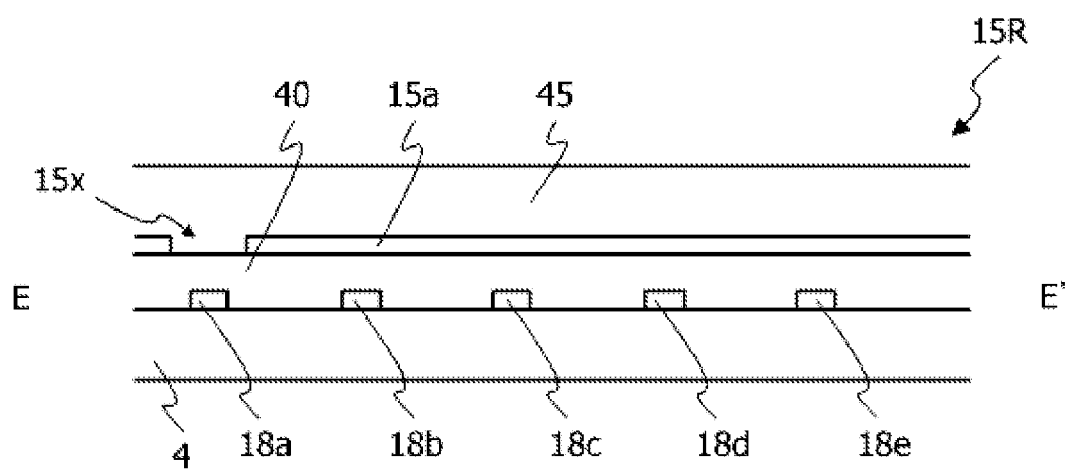
FIG. 18 is a cross-section view of the intersection regions taken along the line E-E' shown in FIG. 17.

In addition, in the above-described exemplary embodiments, the wiring width of the gate leading line 18 is adjusted in the region 15R where the gate leading lines 18 cross the common line 15. Alternatively, or in addition, the wiring width of the common line 15 may also be adjusted as shown in FIG. 13 and FIG. 14. That is to say, when the length of the gate leading lines 18 becomes progressively shorter in the order of the gate leading lines 18a, 18b, 18c, 18d and 18e, the wiring width of the common line 15 can be formed such that the overlapping areas where first line piece 15a overlaps the gate leading lines 18a, 18b, 18c, 18d and 18e become progressively larger in the order of the gate leading lines 18a, 18b, 18c, 18d and 18e. In this case, each gate leading line 18 can have the same width.

In the above-described exemplary embodiments, the common line 15, which acts as the static electric protection line, is formed in part by the first conductive layer and in part by the second conductive layer. Alternatively, the common line 15 may be formed of another conductive layer. For example, a third conductive layer may be formed between the second conductive layer and the pixel electrode 9 to serve as the common line 15.

In the above-described exemplary embodiments, the wiring width or overlapping area of the gate leading lines 18 in the region 15R are different for every gate line in accordance with the wiring lengths of the respective gate leading lines 18. Alternatively, the gate leading lines 18 may be grouped into a plurality of groups such that the wiring widths or overlapping areas in the region 15R are the same within each group, but are set differently from group to group in accordance with the representative length of the gate leading lines 18 in each group. In this case, although the time constants RC of the gate leading lines may not be exactly the same, it is possible to make the time constant RC of the gate leading lines approximately equal to each other without introducing much design burden.

In the above-described exemplary embodiments, the common line 15 is formed so as to completely surround the display area 8. Alternatively, as shown in FIGS. 15, 16, 17, and 18, the common line 15 may be configured to form a disconnecting region 15x at a location or locations where there are the longer gate leading line or lines 18. As long as the overlapping area of the common line with the gate leading line having a shorter wiring length is formed larger than the overlapping area of the common line with the gate leading line having a longer wiring length (which could be zero in the case of the disconnecting region 15x), a difference in the time constant RCs for these longer and shorter gate leading lines can be made small, and therefore the effective voltage of the on-signal as the scanning signal can be made substantially equal for each of the corresponding gate lines.

Also, in the above descriptions, the terms "source" and "drain" are generally interchangeable, and in particular, since the TFTs described in the above-described embodiments are symmetric as far as the structure of the source and drain regions, these terms can be interchanged if appropriate.

It will be apparent to those skilled in the art that various modification and variations can be made in the present invention without departing from the spirit or scope of the invention. Thus, it is intended that the present invention cover modifications and variations that come within the scope of the appended claims and their equivalents.

What is claimed is:

1. A display apparatus, comprising:
a first gate line extended in a predetermined direction;
a second gate line extended in parallel to the first gate line;
a first gate output terminal corresponding to the first gate line;
a second gate output terminal corresponding to the second gate line;
a first gate leading line electrically connecting the first gate line to the first gate output terminal;
a second gate leading line electrically connecting the second gate line to the second gate output terminal and having a length longer than said first gate leading line; and
a static electric protection line disposed so as to overlap the first gate leading line and the second gate leading line with an insulating layer interposed between said static electric protection line and the first and second gate leading lines,
wherein a width of the first gate leading line in a region where the first gate leading line overlaps the static electric protection line is larger than a width of the second gate leading line in a region where the second gate leading line overlaps the static electric protection line, and
wherein an overlapping area between the first gate leading line and the static electric protection line is larger than an overlapping area between the second gate leading line and the static electric protection line.

2. The display apparatus according to claim 1, wherein the static electric protection line has a constant width.

3. The display apparatus according to claim 2, wherein the width of the first gate leading line in a region other than the region where the first gate leading line overlaps the static electric protection line is equal to the width of the second gate leading line in a region other than the region where the second gate leading line overlaps the static electric protection line.

4. The display apparatus according to claim 1, wherein a time constant of the first gate leading line and a time constant of the second gate leading line are set at an equal time constant.

5. The display apparatus according to claim 1, wherein the static electric protection line is formed in a ring so as to surround a display area.

6. The display apparatus according to claim 1, wherein the static electric protection line is set at the same voltage as a common electrode.

7. The display apparatus according to claim 1, wherein the first gate leading line and the second gate leading line are laid around so as to bypass a display area.

8. The display apparatus according to claim 1, wherein the static electric protection line is connected to the first gate line and the second gate line via a static electric protection circuit.

9. The display apparatus according to claim 1, wherein the static electric protection line includes a line piece that is formed in the same layer as a data line, and the first gate leading line and the second gate leading line overlap said line piece of the static electric protection line.

10. A display apparatus comprising:
a plurality of gate lines transmitting a scanning signal to thin film transistors that are formed in pixels;
a plurality of gate leading lines electrically connecting the respective gate leading lines to corresponding designated gate output terminals; and
a static electric protection line crossing the plurality of gate leading lines,
wherein lengths of the plurality of gate leading lines are different with respect to each other, and areas of intersections between the respective gate leading lines and the static electric protection line differ with respect to each other,
wherein a width of a gate leading line with the length thereof being shorter in a region where the gate leading line with the shorter length overlaps the static electric protection line is set larger than a width of a gate leading line with the length thereof being longer in a region where the gate leading line with the longer length overlaps the static electric protection line, and
wherein the area of an intersection between a gate leading line having a shorter length and the static electric protection line is larger than the area of an intersection between a gate leading line having a longer length and the static electric protection line.

11. The display apparatus according to claim 10, wherein the static electric protection line has a constant width.

12. The display apparatus according to claim 11, wherein the widths of the plurality of gate leading lines are equal to each other in a region other than the region where the plurality of gate leading lines overlap the static electric protection line.

13. The display apparatus according to claim 10, wherein time constants of the plurality of gate leading lines are set at an equal time constant.

14. The display apparatus according to claim 10, wherein the static electric protection line is formed in a ring so as to surround a display area.

15. The display apparatus according to claim 10, wherein the static electric protection line is set at the same voltage as a common electrode.

16. The display apparatus according to claim 10, wherein the plurality of gate leading lines are laid around so as to bypass a display area.

17. The display apparatus according to claim 10, wherein the static electric protection line is connected to the plurality of gate lines via a static electric protection circuit.

18. The display apparatus according to claim 10, wherein the static electric protection line includes a line piece that is formed in the same layer as a data line, and the plurality of gate leading lines overlap said line piece of the static electric protection line.

* * * * *